(12) United States Patent
Lin et al.

(10) Patent No.: US 6,237,110 B1
(45) Date of Patent: May 22, 2001

(54) APPARATUS AND METHOD ACCESSING FLASH MEMORY

(75) Inventors: Chanson Lin; Joe Shyu, both of Hsinchu (TW)

(73) Assignee: Kye Technology Corporation, Hsinchu (TW)

( * ) Notice: Subject to any disclaimer, the term of this patent is extended or adjusted under 35 U.S.C. 154(b) by 0 days.

(21) Appl. No.: 09/165,496

(22) Filed: Oct. 2, 1998

(30) Foreign Application Priority Data

Oct. 30, 1997 (TW) .................................................. 96116141

(51) Int. Cl.$^7$ ...................................................... G06F 11/20
(52) U.S. Cl. ................................ 714/7; 711/103; 711/165
(58) Field of Search ................................... 711/103, 115, 711/170, 171, 173, 165; 714/6, 7, 42

(56) References Cited

U.S. PATENT DOCUMENTS

| | | | | |
|---|---|---|---|---|
| 5,473,569 | * | 12/1995 | Chwu | 365/218 |
| 5,566,314 | * | 10/1996 | DeMarco et al. | 395/430 |
| 5,838,614 | * | 11/1998 | Estakhri et al. | 365/185.11 |
| 5,907,856 | * | 5/1999 | Estakhri et al. | 711/103 |
| 6,038,636 | * | 3/2000 | Brown, III et al. | 711/103 |

* cited by examiner

*Primary Examiner*—Robert Beausoleil
*Assistant Examiner*—Scott T. Baderman
(74) *Attorney, Agent, or Firm*—Rosenberg, Klein & Lee

(57) ABSTRACT

A method is suggested for accessing a memory device comprising a plurality of flash memory blocks among which are accessible blocks while some others are spare blocks for usage when there's an overwriting in an accessible block, thereby the substantial difference between a flash memory system and a conventional memory system will not prevent the flash memory system from being applied easily and conveniently, whereby the flash memory system can be used to replace conventional memory systems which are relatively limited by environmental conditions, control mechanism, storage density, as well as reliability.

20 Claims, 11 Drawing Sheets

| Block address code | Function |
|---|---|
| 0 ~ 479 | Explicit Block ExB |
| 480 ~ 494 | Reservation Block |
| 496 ~ 510 | Implicit Block ImB |
| 495、511 | Failure Management Block |

FIG. 1

| | 256W | 256W | 4W | 4W | 1W | 1W | 1W | 1W | 1W | 1W | 1W | 1W |
|---|---|---|---|---|---|---|---|---|---|---|---|---|
| p0 | p0-1 Page | p0-2 Page | ECC1 | ECC2 | P1 | P2 | Erase | Count | ID1 | ID2 | ID3 | R |
| p1 | p1-1 Page | p1-2 Page | ECC1 | ECC2 | Q1 | Q2 | CBI | MBI | RBI | R | R | R |
| p2 | p2-1 Page | p2-2 Page | ECC1 | ECC2 | BI | BI | BI | BI | BI | BI | BI | BI |
| p3 | p3-1 Page | p3-2 Page | ECC1 | ECC2 | BI | BI | BI | BI | BI | BI | BI | BI |
| p4 | p4-1 Page | p4-2 Page | ECC1 | ECC2 | BI | BI | BI | BI | BI | BI | BI | BI |
| p5 | p5-1 Page | p5-2 Page | ECC1 | ECC2 | BI | BI | BI | BI | BI | BI | BI | BI |
| p6 | p6-1 Page | p6-2 Page | ECC1 | ECC2 | BI | BI | BI | BI | BI | BI | BI | BI |
| p7 | p7-1 Page | p7-2 Page | ECC1 | ECC2 | BI | BI | BI | BI | BI | BI | BI | BI |
| p8 | p8-1 Page | p8-2 Page | ECC1 | ECC2 | BI | BI | BI | BI | BI | BI | BI | BI |
| p9 | p9-1 Page | p9-2 Page | ECC1 | ECC2 | BI | BI | BI | BI | BI | BI | BI | BI |
| p10 | p10-1Page | p10-2Page | ECC1 | ECC2 | BI | BI | BI | BI | BI | BI | BI | BI |
| p11 | p11-1Page | p11-2Page | ECC1 | ECC2 | BI | BI | BI | BI | BI | BI | BI | BI |
| p12 | p12-1Page | p12-2Page | ECC1 | ECC2 | BI | BI | BI | BI | BI | BI | BI | BI |
| p13 | p13-1Page | p13-2Page | ECC1 | ECC2 | BI | BI | BI | BI | BI | BI | BI | BI |
| p14 | p14-1Page | p14-2Page | ECC1 | ECC2 | BI | BI | BI | BI | BI | BI | BI | BI |
| p15 | p15-1Page | p15-2Page | ECC1 | ECC2 | BI | BI | BI | BI | BI | BI | BI | BI |

FIG. 2 p0-1 Half Page (P1 - IBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   |   |   |   |   | 1 | 1 |   | 1 | 1 |    |    |    |    |    |    | p0-2 Half Page (P2 - IBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   |   |   |   |   |   |   |   |   |   |    |    |    |    |    |    | p0-1 Half Page (Q1 - IBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 1 |   |   |   |   |   | 1 |   |   |   |    |    |    |    |    |    | p0-2 Half Page (Q2 - IBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   |   |   |   |   | 1 | 1 |   | 1 | 1 |    |    |    |    |    |    | p0-1 Half Page (P1 - CBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   |   |   |   |   |   |   |   |   |   |    |    |    |    |    |    | p0-2 Half Page (P2 - CBlock)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
|   |   |   |   |   |   |   |   |   |   |    |    |    |    |    |    |

FIG. 4B

APPARATUS AND METHOD ACCESSING FLASH MEMORY

FIELD OF THE INVENTION

The present invention relates to a flash memory device, particularly to an apparatus and a method for accessing (reading from and writing in) a plurality of flash memory blocks.

BACKGROUND OF THE INVENTION

Conventional memory devices, either hard disks or floppy disks, are made from material characterized by magnetism, and thereby with access speed inevitably limited by the control mechanism of their access heads.

Furthermore these conventional memory devices may easily be so affected by environmental conditions such as temperature, humidity, or shocks, that the data stored therein may likely get lost or damaged, raising troubles to users.

Usually limited by structures and storage density (capacity per unit of size), IC memories such as RAM and ROM or the like are not suitable for the applications where both size and capacity as well as reliability shall be elaborate.

Developments of various devices have been tried to solve the above problems, among which a solid state disk based on flash memories is quite significant. Therefore the achievement of an apparatus and method for reliably and rapidly accessing the flash memories are widely expected by related industries, especially the realization of an apparatus and method for detouring a fundamental difference between a flash memory device and a conventional memory device is critically expected for easy application. The fundamental difference is that a flash memory device doesn't work in a way of having the data saved (written) in a memory cell (or unit) therein replaced by new data written in the same cell later, as does a conventional memory device. A flash memory device must be formatted into a plurality of blocks each comprising many data memory units each for writing a piece or a set of data therein for only once. Unless a whole block is cleaned (all the data memory units therein are cleaned), any data memory unit which has already had data saved (or written) therein can no longer be written.

SUMMARY OF THE INVENTION

The primary object of the present invention is to provide an apparatus and method for reliably and rapidly accessing (writing data in and/or reading data from) flash memories while maintaining data integrity.

Another object of the present invention is to provide a detection apparatus and method for significantly promoting the reliability of accessing flash memories.

The apparatus provided by the present invention for accessing data therein (writing data in and/or reading data out by a computer or a logic interface, for example) may be configured to be a memory device comprising:

a plurality of flash memory blocks each being assigned an identification code (a binary number, for example) and each including at least one data memory unit and at least one pointer memory unit, the flash memory block to be assigned (by a computer or a logic interface, for example) for accessing the data memory unit thereof; and a plurality of spare flash memory blocks each also being assigned an identification code and also including at least one data memory unit and at least one pointer memory unit.

The data memory unit of the spare flash memory block is for writing at least a piece of overwritten data of the flash memory blocks that is assigned for accessing (writing), the pointer memory unit of the flash memory block for recording the identification code of the spare flash memory block wherein said overwritten data is written, the pointer memory unit of the spare flash memory block for recording the identification code of the flash memory block where the writing of the overwritten data in the data memory unit thereof had been tried but not done because the data memory unit has already had data written therein, and said overwritten data has to be written in the data memory unit of a spare flash memory block, thereby said overwritten data can be saved in the data memory unit of one spare flash memory block, whereby the fundamental difference between a flash memory device and a conventional memory device can be detoured, leading to satisfactory and easy application of flash memories.

The memory device may also comprise at least one reservation flash memory block being assigned an identification code and for substituting the flash memory block and/or the spare flash memory block which fail/fails.

The memory device may further comprises at least one failure management block for recording the identification codes of the flash memory block and the spare flash memory block which fail, and the identification codes of the reservation flash memory blocks substituting the flash memory block and spare flash memory block which fail.

The data memory unit may be configured to comprise a plurality of memory positions each for writing therein a piece of data or a set of data (at least a piece of data) which of course can be read out. Obviously the flash memory block may also be configured to comprise a plurality of data memory units each, as a memory unit (cell) like the above memory position, can be written therein a piece of data or a set of data (at least a piece of data) which of course can be read out. The specification disclosed hereinafter will focus on an embodiment based on the former condition where the data memory unit comprises a plurality of memory positions each for writing therein a piece of data or a set of data (at least a piece of data) which of course can be read out.

The pointer memory unit includes a primary data memory status pointer for recording each written memory position which is a memory position (in the data memory unit of the same flash memory block, for example) where there has been data written therein, and a terminal data memory status pointer for recording each overwritten memory position.

The memory device may have the pointer memory unit of the flash memory block thereof further for recording the identification code of the spare flash memory block where the overwritten data is written in the data memory unit thereof, and have the pointer memory unit of the spare flash memory block thereof for recording the identification code of the flash memory block where the writing of the overwritten data in the data memory unit thereof had been tried but not done because the data memory unit had already have at least one memory position therein been written (or saving) data.

The memory device may have the pointer memory unit of the flash memory block further recording attribute data for distinguishing the flash memory block from the spare flash memory block, and the pointer memory unit of the spare flash memory block further recording attribute data for distinguishing the spare flash memory block from the flash memory block.

The memory device may further comprise an address allocation device and an addressing circuit, the address allocation device for providing the identification code of the flash memory block to be assigned for accessing data therein, the addressing circuit for addressing the flash memory block and the spare flash memory block to be accessed.

An access method characterizing one embodiment of the present invention is for accessing a memory system which includes a plurality of flash memory blocks each having an identification code assigned thereto and each including at least a data memory unit and a pointer memory unit, and includes a plurality of spare flash memory blocks each also having an identification code assigned thereto and also including at least a data memory unit and a pointer memory unit, the pointer memory unit for recording guiding data which includes flag data indicating each written memory position and each overwritten memory position in the data memory unit. The access method comprises a writing process for writing at least a piece of data in a corresponding position in the data memory unit of one of the plurality of flash memory blocks. The writing process comprises the steps of a. assigning a flash memory block to be an access flash memory block;

b. reading the guiding data in the pointer memory unit of the access flash memory block;

c. if the guiding data in the pointer memory unit of the access flash memory block corresponds to (a particular and simple case is that "corresponds to" means "meets") a predetermined first condition (to be explained below), writing the piece of data in the corresponding position in the data memory unit of the access flash memory block, and updating the flag data in the pointer memory unit of the access flash memory block according to the corresponding position;

d. if the guiding data in the pointer memory unit of the access flash memory block corresponds to (a particular and simple case is that "corresponds to" means "meets") a predetermined second condition, selecting a spare flash memory block as an overwritten usage flash memory block to write the piece of data in the corresponding position in the data memory unit thereof, recording as part of the guiding data in the pointer memory unit of the access flash memory block, a pointer value corresponding to the identification code of the overwritten usage flash memory block, updating the flag data in the pointer memory units of both the access flash memory block and the overwritten usage flash memory block according to the corresponding position;

e. if the guiding data in the pointer memory unit of the access flash memory block corresponds to (a particular and simple case is that "corresponds to" means "meets") a predetermined third condition, identifying a spare flash memory block which has the identification code thereof corresponding to a pointer value included in the guiding data, as an overwritten usage flash memory block to write the piece of data in the corresponding position in the data memory unit thereof, and updating the flag data in the pointer memory units of both the overwritten usage flash memory block and the access flash memory block according to the corresponding position;

f. if the guiding data in the pointer memory unit of the access flash memory block corresponds to (a particular and simple case is that "corresponds to" means "meets") a predetermined fourth condition, identifying a spare flash memory block which has the identification code thereof corresponding to a pointer value included in the guiding data, as an overwritten usage flash memory block, moving the data in the data memory unit of the access flash memory block to the data memory unit of the overwritten usage flash memory block, erasing the data in the data memory unit and pointer memory unit of the access flash memory block, recording as part of the guiding data in the pointer memory unit of the access flash memory block a pointer value corresponding to the identification code of the overwritten usage flash memory block, and recording as part of the guiding data in the pointer memory unit of the overwritten usage flash memory block a pointer value corresponding to the identification code of the access flash memory block, and selecting a spare flash memory block different from each of the overwritten usage flash memory block, as a new overwritten usage flash memory block to write the piece of data in the corresponding position in the data memory unit thereof, and updating the flag data in the pointer memory units of both the overwritten usage flash memory block and the new overwritten usage flash memory block according to the corresponding position;

g. recording as part of the guiding data in the pointer memory block of the overwritten usage flash memory block a pointer value corresponding to the identification code of the new overwritten usage flash memory block.

Explanation of predetermined conditions: the predetermined first condition is that the flag data included in the guiding data indicates nonexistence of the overwritten memory position and the corresponding position is different from each written memory position indicated by the flag data included in the guiding data, the predetermined second condition is that the flag data included in the guiding data indicates nonexistence of an overwritten memory position and the corresponding position is one of the written memory position indicated by the flag data included in the guiding data, the predetermined third condition is that the flag data included in the guiding data indicates at least one of the overwritten memory position and the corresponding position is different from each overwritten memory position indicated by the flag data included in the guiding data, the predetermined fourth condition is that the flag data included in the guiding data indicates at least one of the overwritten memory position and the corresponding position is one of the overwritten memory position indicated by the flag data included in the guiding data.

The access method may be so configured that step a comprises the steps:

a1. selecting a flash memory block as an assigned flash memory block to read an actual access block (shown as IB in figure) (or called access flash memory block) identification code included in the guiding data in the pointer memory unit thereof; and a2. assigning a flash memory block which has the identification code thereof corresponding to the actual access block (shown as IB in figure) (or called access flash memory block) identification code as an access flash memory block.

The access method may be so configured that in step a1 a flash memory block having the identification code thereof associated with the piece of data is selected for reading the actual access block (or called access flash memory block) identification included in the guiding data in the pointer memory unit thereof.

The access method may be so configured that in step a1 a flash memory block having the identification code thereof associated with an assigned position for writing the piece of data is selected for reading the actual access block (or called access flash memory block) identification code included in the guiding data in the pointer memory unit thereof.

The access method may be so configured that the assigned position is provided by an address allocation device (not to be shown in figure).

The access method may be so configured that step f comprises a step of recording as part of the guiding data in the pointer memory unit of the access flash memory block, a piece of attribute data for indicating that the access flash memory block becomes one of the spare flash memory blocks.

The access method further comprises, before step a, the step of:
- a0. providing at least one reservation flash memory block having an identification code assigned thereto, and at least one failure management block;

and after step a, the step of
- a3. detecting if the access flash memory block fails, in case the access flash memory block fails, substituting the reservation flash memory block for the access flash memory block, and recording in the failure management block the identification codes of both the access flash memory block and the reservation flash memory block substituting the access flash memory block.

The access method further comprises a reading step of reading the data in the data memory unit of a flash memory block which is assigned to be a source flash memory block, the reading step comprising the steps of
- reading an actual access block identification code included in the guiding data in the pointer memory unit of the source flash memory block;
- identifying a flash memory block having the identification code thereof corresponding to the actual access block identification code as an actual reading block, to read the guiding data in the pointer memory unit thereof;
- if the guiding data in the pointer memory unit of the actual reading block meets a predetermined fifth condition, reading the data in the data memory unit of the actual reading block;
- if the guiding data in the pointer memory unit of the actual reading block meets a predetermined sixth condition, identifying a flash memory block having the identification code thereof corresponding to a reader pointer value included in the guiding data, to read the data in the data memory unit thereof.

The predetermined fifth condition is that the flag data included in the guiding data indicates nonexistence of the overwritten memory position, and the predetermined sixth condition is that the flag data included in the guiding data indicates at least one overwritten memory position.

The access method may be so configured that step a further comprises, after step a2, the steps of:
- a4. reading a reverse pointer value included in the guiding data in the pointer memory unit of the access flash memory block;
- a5. if the reverse pointer value corresponds (a particular and simple case is that "corresponds" means "equals") the identification code of the assigned flash memory block, go to step b;
- a6. if the reverse pointer value corresponds (a particular and simple case is that "corresponds" means "equals") to the identification code of a reverse pointing flash memory block which is a flash memory block different from the assigned flash memory block, reading an actual access block identification code included in the guiding data in the pointer memory unit of the reverse pointing flash memory block;
- a7. if the actual access block identification code included in the guiding data in the pointer memory unit of the reverse pointing flash memory block corresponds (a particular and simple case is that "corresponds" means "equals") to the identification code of the access flash memory block, reading a reverse pointer value included in the guiding data in the pointer memory unit of each flash memory block until finding a real access flash memory block which is a flash memory block having a reverse pointer value included in the guiding data in the pointer memory unit thereof corresponding to the identification code of the assigned flash memory block, replacing the actual access block identification code included in the guiding data in the pointer memory unit of the assigned flash memory block by an identification code corresponding to the real access flash memory block;
- a8. if the actual access block identification code included in the guiding data in the pointer memory unit of the reverse pointing flash memory block corresponds (a particular and simple case is that "corresponds" means "equals")to the identification code of a flash memory block different from the access flash memory block, replacing the reverse pointer value included in the guiding data in the pointer memory unit of the access flash memory block by an identification code corresponding to the assigned flash memory block.

Another version of access method based on the present invention is for accessing a memory system which includes a plurality of flash memory blocks each having an identification code assigned thereto and including at least a data memory unit and a pointer memory unit, and includes a plurality of spare flash memory blocks each also having an identification code assigned thereto and including at least a data memory unit and a pointer memory unit, the pointer memory unit for recording guiding data which includes flag data indicating each written memory position and each overwritten memory position in the data memory unit, the access method may comprises a writing process for writing at least a piece of data in a corresponding position in the data memory unit of an assigned flash memory block, the writing process comprises the steps of
- a. reading an actual access block identification code included in the guiding data in the pointer memory unit of the assigned block, and identifying a flash memory block which has the identification code thereof corresponding to the actual access block identification code as an access flash memory block.
- b. reading the guiding data in the pointer memory unit of the access flash memory block;
- c. if the guiding data in the pointer memory unit of the access flash memory block corresponds to (a particular and simple case is that "corresponds to" means "meets") a predetermined first condition, writing the piece of data in a corresponding position in the data memory unit of the access flash memory block, and updating the flag data in the pointer memory unit of the access flash memory block according to the corresponding position;
- d. if the guiding data in the pointer memory unit of the access flash memory block corresponds to (a particular and simple case is that "corresponds to" means "meets") a predetermined second condition, selecting a spare flash memory block as an overwritten usage flash memory block to write the piece of data in a corresponding position in the data memory unit thereof, recording in the pointer memory unit of the access flash memory block, as part of the guiding data, a pointer value corresponding to the identification code of the overwritten usage flash memory block, updating the flag data in the pointer memory units of both the access flash memory block and the overwritten usage flash memory block;

e. if the guiding data in the pointer memory unit of the access flash memory block corresponds to (a particular and simple case is that "corresponds to" means "meets") a predetermined third condition, identifying a spare flash memory block which has the identification code thereof corresponds (a particular and simple case is that "corresponds" means "equals") to a pointer value included in the guiding data, as an overwritten usage flash memory block to write the piece of data in a corresponding position in the data memory unit thereof;

f. if the guiding data in the pointer memory unit of the access flash memory block corresponds to (a particular and simple case is that "corresponds to" means "meets") a predetermined fourth condition, identifying a spare flash memory block which has the identification code thereof corresponds (a particular and simple case is that "corresponds" means "equals") a pointer value included in the guiding data, as an overwritten usage flash memory block, moving the data in the data memory unit of the access flash memory block to the data memory unit of the overwritten usage flash memory block, erasing the data in the data memory unit and pointer memory unit of the access flash memory block, recording as part of the guiding data in the pointer memory unit of the access flash memory block a pointer value corresponding to the identification code of the overwritten usage flash memory block, and recording as part of the guiding data in the pointer memory unit of the overwritten usage flash memory block a pointer value corresponding to the identification code of the access flash memory block, and selecting a spare flash memory block different from each overwritten usage flash memory block, as a new overwritten usage flash memory block to write the piece of data in a corresponding position in the data memory unit thereof; and g. recording as part of the guiding data in the pointer memory block of the overwritten usage flash memory block a pointer value corresponding to the identification code of the new overwritten usage flash memory block.

The present invention may best be understood through the following description with reference to the accompanying drawings, in which.

BRIEF DESCRIPTION OF THE DRAWINGS

FIG. 1 is a table illustrating the configuration of an example of a flash memory device pre-formatted into four types of blocks;

FIG. 2 shows an example for illustrating the structure of a flash memory block or a spare flash memory block;

FIG. 4A and FIG. 4B show an example of operation when there's an overwriting in a flash memory device (DB);

Figures 3A, 3B, 3C:
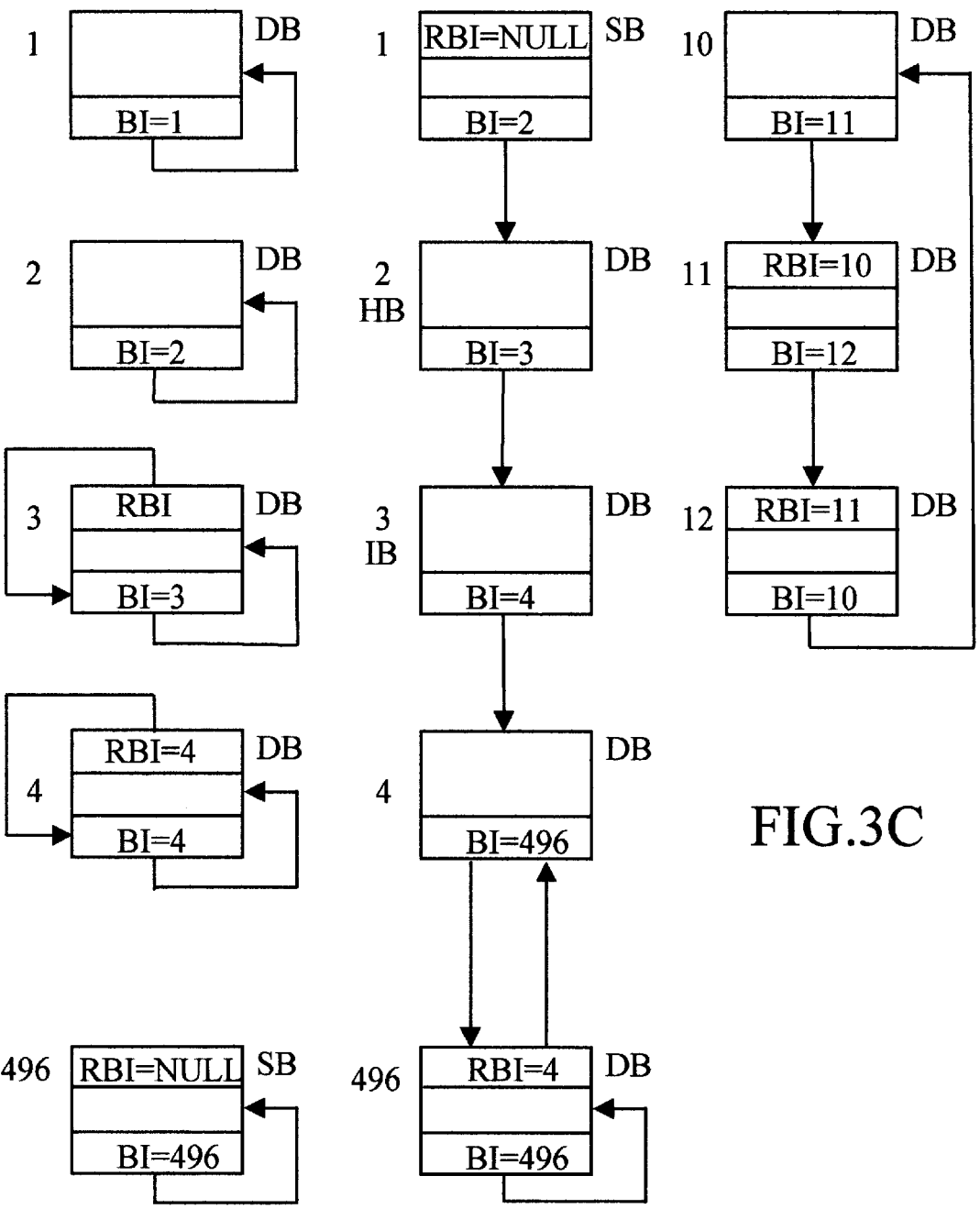
FIG. 3A shows a flash memory device illustrated by the table shown in FIG. 1, which is formatted before being put on line.
FIG. 3B shows a structure which may be one type of evolution of the flash memory block shown in FIG. 3A when a double overwriting happens.
FIG. 3C shows another structure of a flash memory device, as a result of evolution after being put on line for some time.

DEFINITIONS written memory position:
  the memory position which is in a data memory unit and which has been written data therein once;
overwritten data of a flash memory block:
  the data that was to be written in a corresponding position in a flash memory block, but was not actually written therein because the corresponding position had become a written memory position;
overwritten data memory unit:
  a data memory unit becomes an overwritten data memory unit as soon as it has one written memory position written again (a piece of data corresponding to the written memory position was still to be written therein, for example), i.e., a data memory unit becomes an overwritten data memory unit as soon as it has a memory position written twice (the writing at the first time had been completed but the second writing is transferred to the corresponding position in a spare flash memory block);
overwritten memory position:
  the memory position which is in a data memory unit and which was the first written memory position that was written again, or the memory position which is in an overwritten data memory unit and which was written only once; because the data which was to be written in a written memory position in a flash memory block was not actually written therein, instead it was written in its corresponding position in the data memory unit of a spare flash memory block, and any data to be written in the overwritten data memory unit shall be written in its corresponding position in the data memory unit of the spare flash memory block regardless the availability of its corresponding position in the overwritten data memory unit, it will be more convenient to keep record of the memory positions wherein there had been data to be written but the data was not actually written therein, the data was written in a corresponding position in another flash memory block instead;

overwriting in a block:
at least one written memory position in the block is written again; double overwriting:
an overwritten memory position is written again.

DETAILED DESCRIPTION OF THE PREFERRED EMBODIMENTS

Shown in FIG. 1 is a table illustrating the configuration of an example of a flash memory device pre-formatted into four types of blocks: blocks with address codes (one type of identification code) ranging from 0 to 479 are explicit blocks (ExB), those with address codes ranging from 480 to 494 are reservation blocks (RVB), those with address codes ranging from 496 to 510 are implicit blocks (ImB), and those with address codes 495 and 511 are defect management table blocks (DMTB, also called "failure management block"). The configuration can be so preset that the ExB can be accessed through logic addressing (digital binary addressing line, for example) while the ImB can't. Either an ExB or ImB includes at least a data memory unit and a pointer memory unit. Each ExB in the example is preset to be a flash memory block which can be assigned for accessing data in a data memory unit therein through logic addressing. Each ImB in the example is preset to be a spare flash memory block (before access operation) available for writing a piece of (or a set of) overwritten data in a data memory unit therein. The overwritten data is the data which should have been written in a data memory unit of an assigned or addressed flash memory block (the flash memory block assigned or addressed through logic addressing for accessing) if there hadn't been an overwriting in the assigned (or addressed) flash memory block.

The reservation flash memory blocks (RVB) each assigned an identification code (may be an address code) are for substituting the flash memory blocks and/or the spare flash memory blocks which fail/fails. The failure management block (DTMB) is for recording the identification codes of the flash memory block and the spare flash memory block which fail, and the identification codes of the reservation flash memory blocks substituting the flash memory block and spare flash memory block which fail.

One aspect of a flash memory device is that a flash memory block as well as a spare flash memory block comprises a plurality of data memory units each for writing a piece or set of data (for only once, according to one feature of the flash memory device), some data memory units of a flash memory block at one time after the flash memory block was put on line may have data saved or written therein, while another piece or set of data (called overwritten data) may have to be written, any time later, in one of the flash memory block's data memory units which had been written, resulting in an overwriting in the flash memory block, leading to a need of writing the overwritten data in another block which clearly must be a spare flash memory block.

Another aspect of a flash memory device is that a flash memory block as well as a spare flash memory block comprises one or more than one data memory unit each composed of a plurality of memory positions each for writing a piece or set of data (for only once, according to one feature of the flash memory device), some memory positions in a flash memory block at one time after the flash memory block was put on line may have data saved or written therein, while another piece or set of data may have to be written, any time later, in one memory position therein which had been written (here the "another piece or set of data" is called "overwritten data"), resulting in an overwriting in the flash memory block, leading to a need of writing the overwritten data in another block which clearly must be a spare flash memory block.

The equivalence between the above two aspects of a flash memory device is so obvious that the embodiments according to the present invention described hereinafter will refer to only one of the above aspects.

An example for illustrating the structure of a flash memory block (or a spare flash memory block) is shown in FIG. 2 where the data memory unit of the flash memory block is composed of p0-1 memory page (or called memory position), p0-2 memory page, p1-1 memory page, p1-2 memory page, . . . , p15-1 memory page, and p15-2 memory page, each functioning as a memory position, and the pointer memory unit which may be the spare memory space or the rest memory space of an ordinary flash memory block, can be used to record data such as guiding data including flag data indicating each written memory position and overwritten memory position; error correction code (ECC); defect identification code (ID1–ID3); Erase Count for indicating the times of erasing done for the flash memory block; CBI as a pointer value for indicating the identification code of the spare flash memory block wherein the data memory unit is written the overwritten data that should have been written in the data memory unit of the flash memory block addressed or assigned for writing; MBI, when in a spare flash memory block, for indicating the identification code of the flash memory block wherein there's an overwriting and the overwritten data is written in the data memory unit of the spare flash memory block; BI (actual access block identification code), when in an assigned block, indicating the identification code of the actual access flash memory block which is the flash memory block to be actually accessed; RBI (reverse pointer value), when in an actual flash memory block, indicating the identification code of the assigned block with BI indicating the identification code of the actual flash memory block, for detecting the error of BI; and some other data. The pointer memory unit may comprise a primary data memory status pointer P1 and P2 and a terminal data memory status pointer Q1 and Q2, P1 for recording the flag data indicating each written memory position among memory positions: p0-1 memory page, p1-1 memory page, p2-1 memory page, . . . , and p15-1 memory page, P2 for recording the flag data indicating each written memory position among memory positions: p0-2 memory page, p1-2 memory page, p2-2 memory page, . . . , and p15-2 memory page, Q1 for recording the flag data indicating each overwritten memory position among memory positions: p0-1 memory page, p1-1 memory page, p2-1 memory page, . . . , and p15-1 memory page, and Q2 for recording the flag data indicating each overwritten memory position among memory positions: p0-2 memory page, p1-2 memory page, p2-2 memory page, . . . , and p15-2 memory page.

According to the present invention, a flash memory device illustrated by the table shown in FIG. 1 is formatted, before being put on line, to be of a structure shown in FIG. 3A, where all explicit blocks are preset to be flash memory blocks (DB) such as those with identification codes (or called address codes) 1, 2, 3, 4; all implicit blocks are preset to be spare flash memory blocks such as the one with identification code 496 shown in FIG. 3A; the actual access block (shown as BI in FIG. 3A) (or called access flash memory block) identification code (BI) of each block, either a flash memory block or a spare flash memory block, points to itself (equals the identification code of itself), and the RBI (reverse pointer value) (not shown in figure) of each flash memory block also points to itself. That means a flash memory block itself is accessed when assigned for accessing.

After being put on line for some time, due to the operation of locating (or selecting) a spare flash memory block as an overwritten usage flash memory block for writing a piece or a set of overwritten data of a flash memory block (the overwritten data of a flash memory block is the data which should have been written in the flash memory block if there had been no overwriting in the flash memory block) and locating (or selecting) another spare flash memory block as a new overwritten usage flash memory block for writing double overwritten data (there's an overwriting in the overwritten usage flash memory block), the flash memory device structured in FIG. 3A may evolve to be of a structure shown in FIG. 3B where flash memory block with identification code 1 ("flash memory block with identification code n" is denoted by "flash memory block n" hereinafter) has become a spare flash memory block, and with BI thereof pointing to flash memory block 2, BI of flash memory block 2 points to flash memory block 3, BI of flash memory block 3 points to flash memory block 4, BI of flash memory block 4 points to the implicit block with identification code 496 which has become a flash memory block with BI pointing to itself to act as a terminal block.

Another structure of a flash memory device according to the present invention, as a result of evolution after being put on line for some time, may become the one characterized by FIG. 3C where the direction pointed by the BI of each flash memory block constitutes a loop.

Figure 4A:
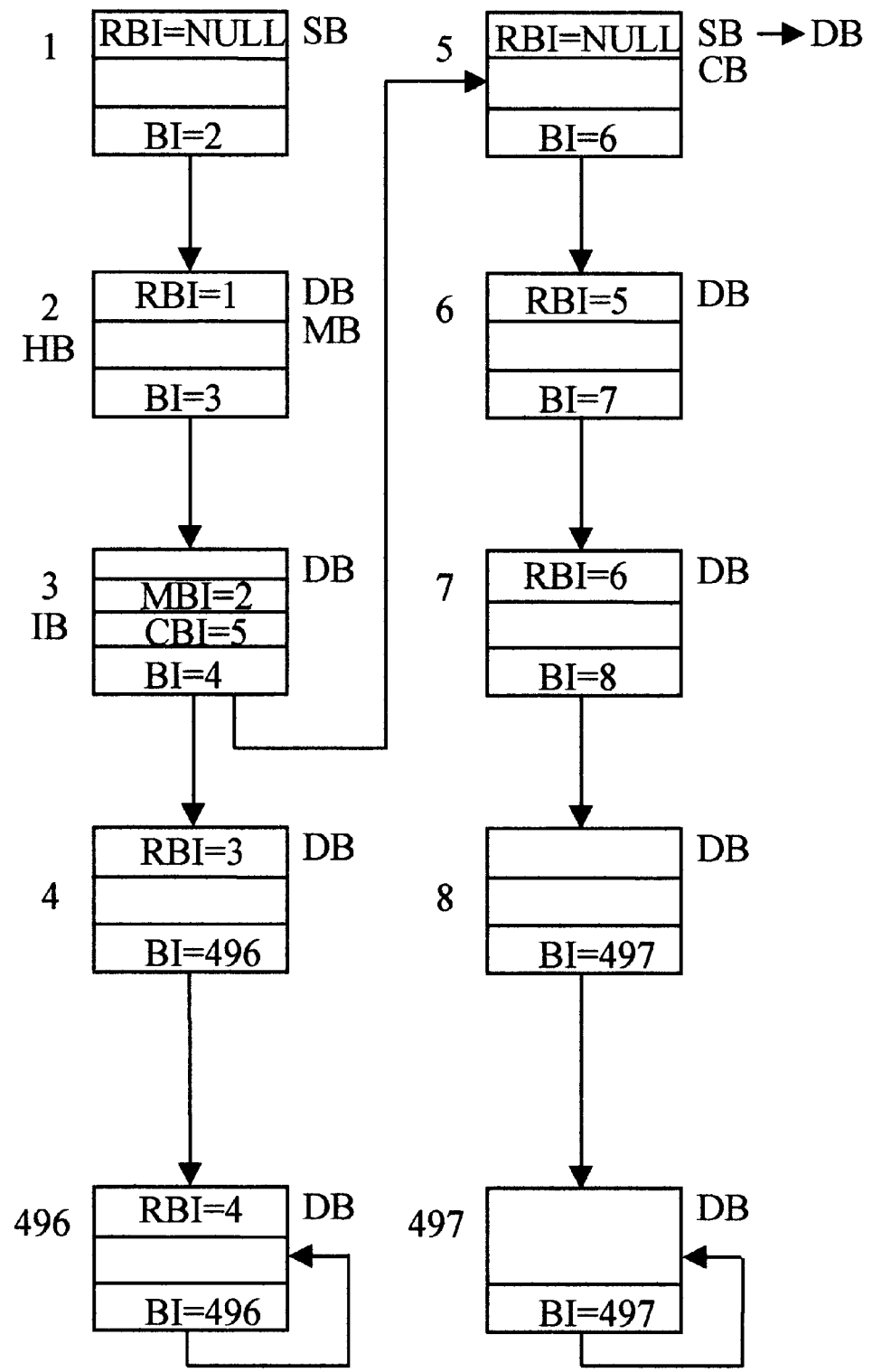

FIG. 4A and FIG. 4B show an example of operation, according to the present invention, when there's an overwriting in a flash memory device (DB), where flash memory block 2 is assigned for accessing (writing), and the actual access block (IB in FIG.4A) is flash memory block 3 because BI=3 in flash memory block 2, and there's an overwriting in flash memory block 3. Before the happening of an overwriting, the flag data (P1 table in FIG. 4B) indicates that the memory pages p5-1, p6-1, p8-1, and p9-1 have been written (have data saved therein) by recording 1 in the positions corresponding to these memory pages (empty position means that its corresponding memory page is empty). Now if there's data to be written in memory page p6-1, an overwriting is known by checking the corresponding position in P1 table before the data (called "overwritten data of flash memory block 3) will be actually written in memory page p6-1 of flash memory block 3. A spare flash memory block (SB) such as spare flash memory block 5 (SB) is located as an overwritten usage flash memory block (spare flash memory block 5 shall become a flash memory block denoted by flash memory block 5, and the change is denoted by "SB→DB" in FIG. 4A) for writing, in the memory page p6-1 thereof, the overwritten data of flash memory block 3, and the corresponding position (bit memory position) in Q1 table of flash memory block 3 in FIG. 4B records 1 to indicate that there has been an overwriting in memory page p6-1 of flash memory block 3, while the corresponding position (bit memory position) in P1 table of flash memory block 5 in FIG. 4B records 1 to indicate that memory page p6-1 of flash memory block 5 has been written, and records pointer value CBI=5 as part of guiding data in flash memory block 3.

It must be noted that all the data to be written in flash memory block 2 shall now be written in the overwritten usage flash memory block 5 instead of access flash memory block 3, regardless of the availability of memory positions in block 3.

Referring to FIG. 4B, even though the corresponding position in table P1 doesn't record 1, indicating the memory page p7-1 has not been written, the data to be written in memory page (or called memory position) p7-1 is written in its corresponding position in the overwritten usage flash memory block 5 despite the availability of p7-1.

In case flash memory block 2 is assigned for reading the memory page (or called memory position) p6-1 thereof, flash memory block 5 will be located for reading the memory page (or called memory position) p6-1 thereof through BI=3 in flash memory block 2 and CBI=5 in flash memory block 3. However, flash memory block 3 is still the flash memory block for reading the memory page (or called memory position) p5-1 thereof if flash memory block 2 is assigned for reading the memory page (or called memory position) p5-1 thereof, because BI=3 in flash memory block 2 and there have been no overwriting in memory page (or called memory position) p5-1 of flash memory block 3 according to P1 table of flash memory block 3. It must be noted that the actual access block (shown as IB in figure) (or called access flash memory block) is flash memory block 4 if flash memory block 3 is assigned for accessing because BI=4 in flash memory block 3.

Figure 4C:
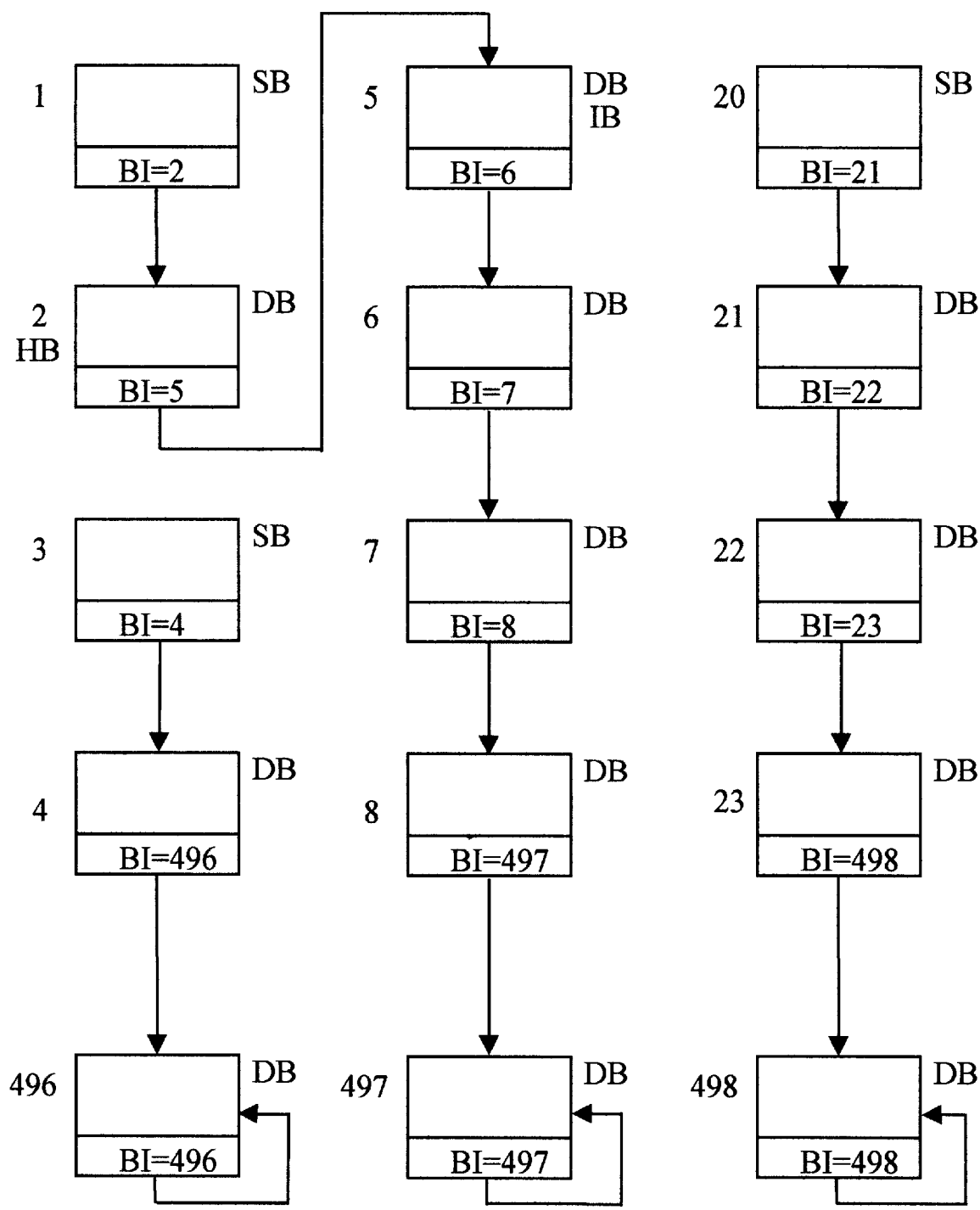
FIG. 4C shows an operation example for processing a double overwriting.
Figure 4D:
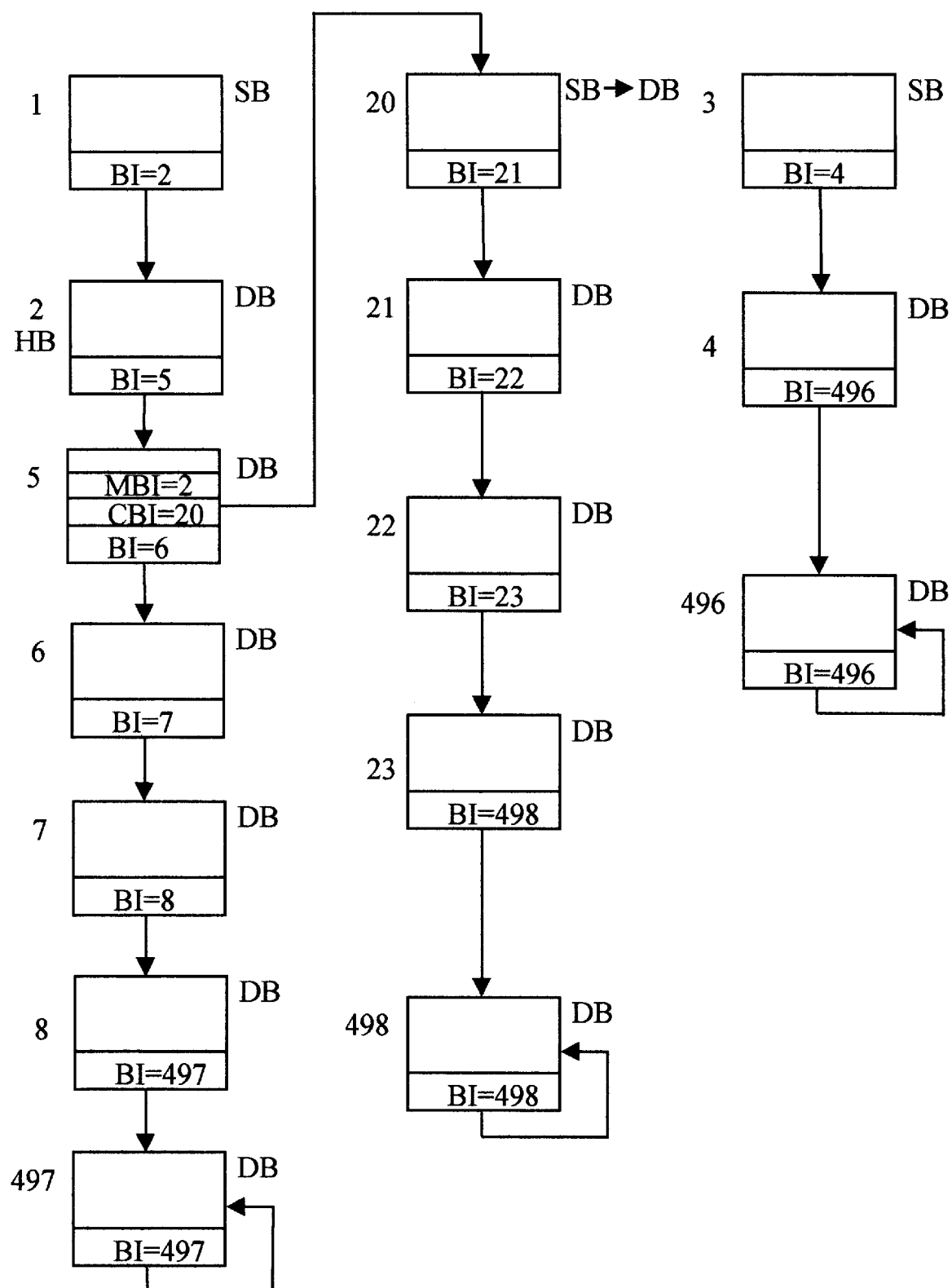
FIG. 4D shows a further operation example for processing overwriting data in a flash memory block.

Based on FIG. 4A which shows the operation to write the overwritten data of flash memory block 3 in the overwritten usage flash memory block (is current flash memory block 5 as spare flash memory block 5 has been changed to be a flash memory block, as denoted by "SB→DB" in FIG. 4A), if flash memory block 2 is again assigned for writing data in memory page (or called memory position) p6-1 thereof, the actual access block (shown as IB in figure) should be flash memory block (DB) 3 because BI=3 in flash memory block (DB) 2. However, it shall be found from flag data (Q1 table) in flash memory block (DB) 3 that memory page (or called memory position) p6-1 has been overwritten, and a double overwriting is concluded, leading to a need of locating (or selecting) a spare flash memory block (DB) as a new overwritten usage flash memory block for further writing, moving useful data in flash memory block (DB) 3, such as the data in each of the memory pages which have not been overwritten (i.e., each page whose corresponding position in table P1 or P2 has 1 recorded therein while corresponding position in table Q1 or Q2 is empty) as well as the flag data (such as that included in tables P1, P2, Q1, and Q2), to flash memory block (DB) 5; erasing all the data in flash memory block (DB) 3 and changing the attribute data of flash memory block 3 to indicate that flash memory block 3 has become a spare flash memory block (SB in the figure), and updating BI to let BI=5 in flash memory block 2, as shown in FIG. 4C. It must be noted the RBI (reverse pointer value) in flash memory block 5 is now equal to 2 (RBI (reverse pointer value)=2) although it is not shown in FIG. 4C. The rest steps are the same as the operations done for writing the overwritten data from a flash memory block to a spare flash memory block (SB), as shown in FIG. 4D where spare flash memory block (SB) 20 is located as a new overwritten usage flash memory block for writing the overwritten data of flash memory block 5 (spare flash memory block 5 has become flash memory block 5) and pointer value CBI=20 indicating that spare flash memory block 20 is the new overwritten usage flash memory block. RBI (reverse pointer value) of each block, either flash memory block or spare flash memory block, shall normally point to the other block which has BI thereof pointing to the block having the RBI (reverse pointer value).

Figure 5:
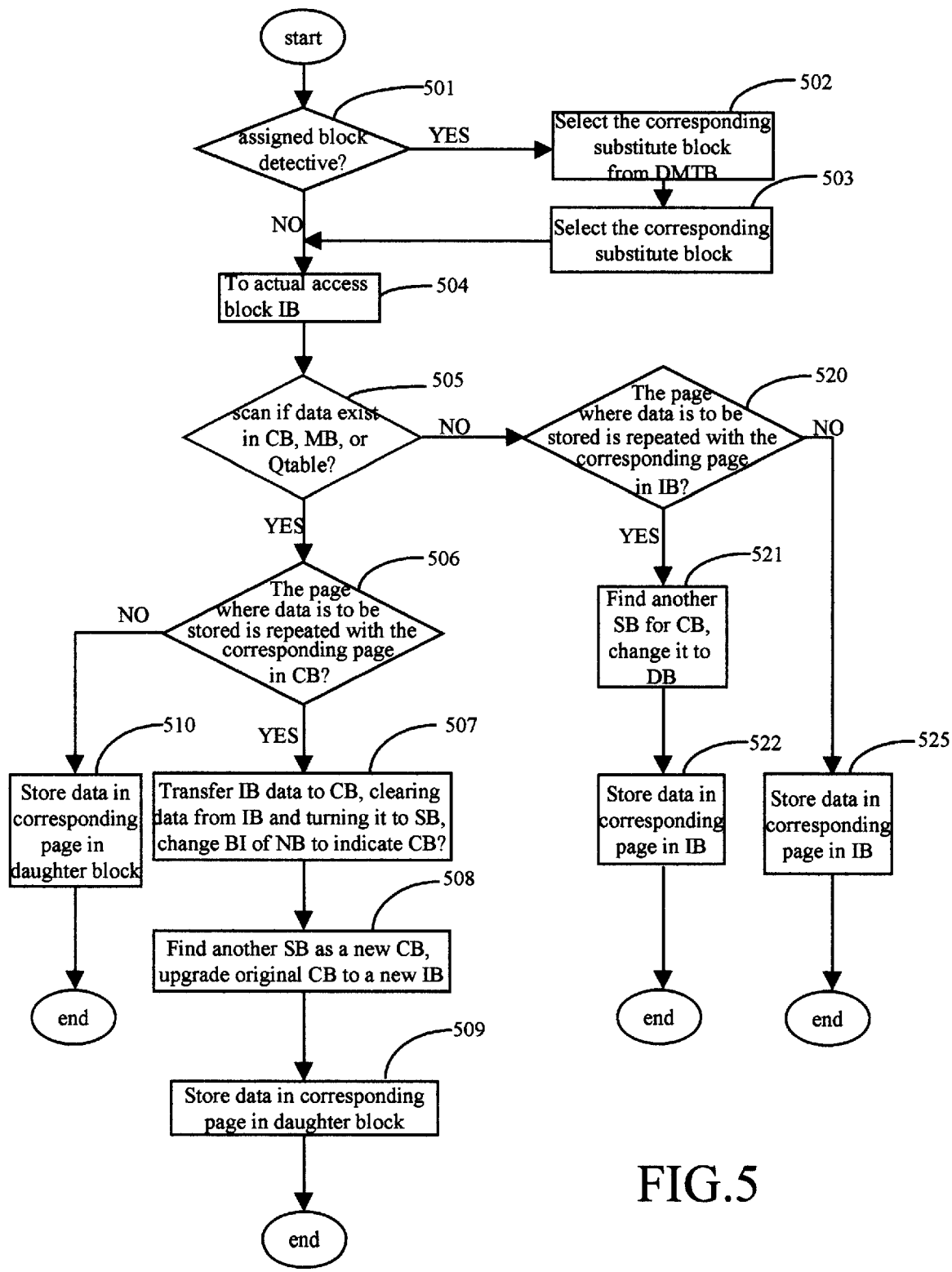
FIG. 5 shows steps of a writing process of an access method characterizing one embodiment of the present invention for accessing a memory system.

Shown in FIG. 5 are steps of a writing process of an access method characterizing one embodiment of the present invention for accessing a memory system which includes a plurality of flash memory blocks each having an identification code assigned thereto and each including at least a data memory unit and a pointer memory unit, and which also includes a plurality of spare flash memory blocks each also having an identification code assigned thereto and also including at least a data memory unit and a pointer memory unit, the pointer memory unit for recording guiding data which includes flag data indicating each written memory position and each overwritten memory position. The memory system also includes at least one reservation flash memory block and one failure management block. The writing process is for writing at least a piece of data (or a set of data) in a corresponding position in the data memory unit of an assigned block which is the flash memory block assigned for writing the piece of data. The writing process comprises the steps shown in FIG. 5, as will be described below and accompanied with further explanation of predetermined conditions.

- step 501: detecting if the assigned flash memory block fails, go to step 502 if yes and step 504 if no;
- step 502: finding from the failure management block the identification code of the reservation flash memory block having substituted the assigned block;
- step 503: locating (or selecting), according to the identification code found from the failure management block, the reservation flash memory block as the assigned block, and go to step 504;
- step 504: reading an actual access block (shown as IB in figure) (or called access flash memory block) identification code (BI) included in the guiding data in the pointer memory unit of the assigned flash memory block, and locating (or selecting) the flash memory block with identification code corresponding to (equal to, for example) the actual access block identification code as an access flash memory block (IB);
- step 505: detecting if there had been an overwriting in the access flash memory block (i.e.,if any bit memory position in the Q1 or Q2 table of the flag data of the access flash memory block records 1, for example), go to step 520 if no and step 506 if yes;
- step 520: detecting if the corresponding position is different from each written memory position indicated by flag data included in the guiding data, go to step 525 if yes (the guiding data, i.e., the flag data included therein, corresponds to the predetermined first condition) and go to step 521 if no (the guiding data, i.e., the flag data included therein, corresponds to the predetermined second condition);
- step 521: locating (or selecting) a spare flash memory block as an overwritten usage flash memory block and changing its attribute data (included in the guiding data) thereof to indicate it has become a flash memory block;
- step 522: writing the piece of data (or the set of data) in the corresponding position in the data memory unit of the overwritten usage flash memory block, and updating the guiding data (flag data such as that recorded in P1, P2, Q1, or Q2 table) in the pointer memory unit thereof according to the corresponding position, recording as part of the guiding data in the pointer memory unit of the access flash memory block, a pointer value such as CBI corresponding to the identification code of the overwritten usage flash memory block.
- step 525: writing the piece of data in the corresponding position in the data memory unit of the access flash memory block, and updating the flag data (included in the guiding data) in the pointer memory unit of the access flash memory block according to the corresponding position;
- step 506: identifying a spare flash memory block with identification code thereof corresponding to the pointer value CBI in the access flash memory block, as an overwritten usage flash memory block, and detecting if the corresponding position is different from each written memory position indicated by flag data included in the guiding data, go to step 510 if yes (the guiding data, i.e., the flag data included therein, corresponds to the predetermined third condition) and go to step 507 if no (the guiding data, i.e., the flag data included therein, corresponds to the predetermined fourth condition);
- step 507: moving the data in the data memory unit of the access flash memory block to the data memory unit of the overwritten usage flash memory block, also moving the data in the tables P1, P2, Q1, Q2 included in the flag data of the access flash memory block to pointer memory unit of the overwritten usage flash memory block, erasing the data in the data memory unit and pointer memory unit of the access flash memory block, updating the actual access block identification code BI in the assigned flash memory block so that BI corresponding to (equal to, for example) the identification code of the overwritten usage flash memory block;
- step 508: selecting one from among the spare flash memory blocks as a new overwritten usage flash memory block (definitely different from an overwritten usage flash memory block because an overwritten usage flash memory block is currently a flash memory block instead of a spare flash memory block), recording as part of the guiding data in the pointer memory unit of the overwritten usage flash memory block a pointer value MBI corresponding to the identification code of the assigned flash memory block;
- step 509: writing the piece of data in the corresponding position in the data memory unit of the new overwritten usage flash memory block, updating the pointer value CBI in the overwritten usage flash memory block so that the CBI corresponds to (equal to, for example) the identification code of the new overwritten usage flash memory block, and updating the flag data (record I in the bit memory position of table P1, P2, Q1, Q2) in the pointer memory units of both the overwritten usage flash memory block and new overwritten usage flash memory block according to the corresponding position in which the piece of data was written.
- step 510: writing the piece of data (or the set of data) in the corresponding position in the data memory unit of the overwritten usage flash memory block, and updating the guiding data (flag data such as that recorded in P1, P2, Q1, or Q2 table) in the pointer memory unit thereof according to the corresponding position, recording as part of the guiding data in the pointer memory unit of the access flash memory block, a pointer value such as CBI corresponding to the identification code of the overwritten usage flash memory block.

Further explanation of predetermined conditions: the predetermined first condition is that the flag data included in the guiding data indicates nonexistence of the overwritten memory position (i.e., no "1" is recorded in table Q1 and Q2) and the corresponding position is different from each written memory position (i.e., no "1" is recorded in the corresponding position in table P1 and P2) indicated by the flag data included in the guiding data, the predetermined second condition is that the flag data included in the guiding data indicates nonexistence of an overwritten memory position and the corresponding position is one of the written memory position (i.e.,the corresponding position in table P1 or P2 records "1") indicated by the flag data included in the guiding data, the predetermined third condition is that the flag data included in the guiding data indicates the existence of at least one of the overwritten memory position (i.e., at least one bit memory position records "1") and the corresponding position is different from each overwritten memory position (i.e., no "1" is recorded in the corresponding position in table Q1 or Q2) indicated by the flag data included in the guiding data, the predetermined fourth condition is that the flag data included in the guiding data indicates the existence of at least one of the overwritten memory position and the corresponding position is one of the overwritten memory position (i.e., the corresponding position in table Q1 or Q2 records "1") indicated by the flag data included in the guiding data.

It must be noted that the reading process is not necessarily subject to either the order of the above steps or the order of each operation in any step.

Figure 6A:
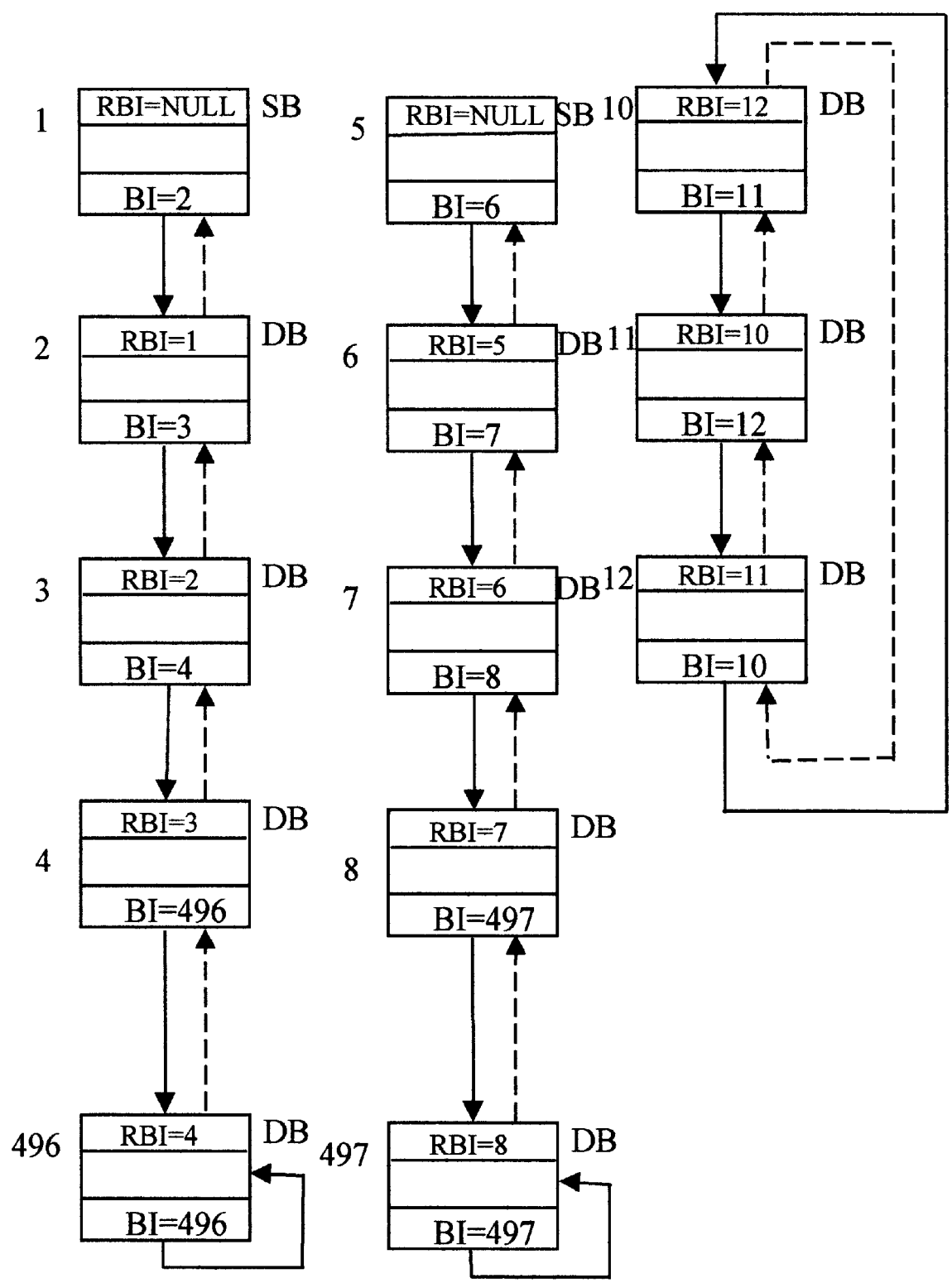
FIG. 6A shows a detection scheme suggested the present invention for assuring the reliability of BI pointing to a right actual access block.

To avoid relation error (such as that BI points to a wrong flash memory block, causing a mistake of selecting a wrong flash memory block as the actual access block (shown as IB in figure) of an assigned block) due to recording data (such as CBI, BI, etc) error resulting from external environment abnormality, the present invention also suggests a detection scheme for assuring the reliability of BI pointing to a right actual access block (shown as IB in figure) by having RBI (reverse pointer value) included in the flag data in the pointer memory unit of each flash memory block and spare flash memory block, as shown in FIG. 6A where symbol "→" represents the direction from a primary block (a potential assigned block, either a flash memory block or a spare flash memory block) to the other block (potential actual access block) with identification code thereof corresponding (equal, for example) to the BI in the primary block while symbol "← . . . " represents the direction from a potential actual access block to a primary block (a potential assigned block, either a flash memory block or a spare flash memory block) with identification code thereof corresponding (equal, for example) to the RBI (reverse pointer value) in the potential actual access block. Obviously an actual access block (shown as IB in FIG. 6A) pointed by the BI in a primary block should normally have the RBI (reverse pointer value) therein pointing to the primary block, and vice versa. The reliability can thus be significantly promoted by checking the directions of both BI and RBI (reverse pointer value). It must be noted that a spare flash memory block can't be an actual access block (shown as IB in FIG. 6A) because it is normally empty, and the flash memory block with identification code 496 or 497 has BI pointing to itself because any flash memory block with identification code among 496~510 is an implicit block according to the table of FIG. 1, and thereby can't be an assigned block.

Figure 6B:
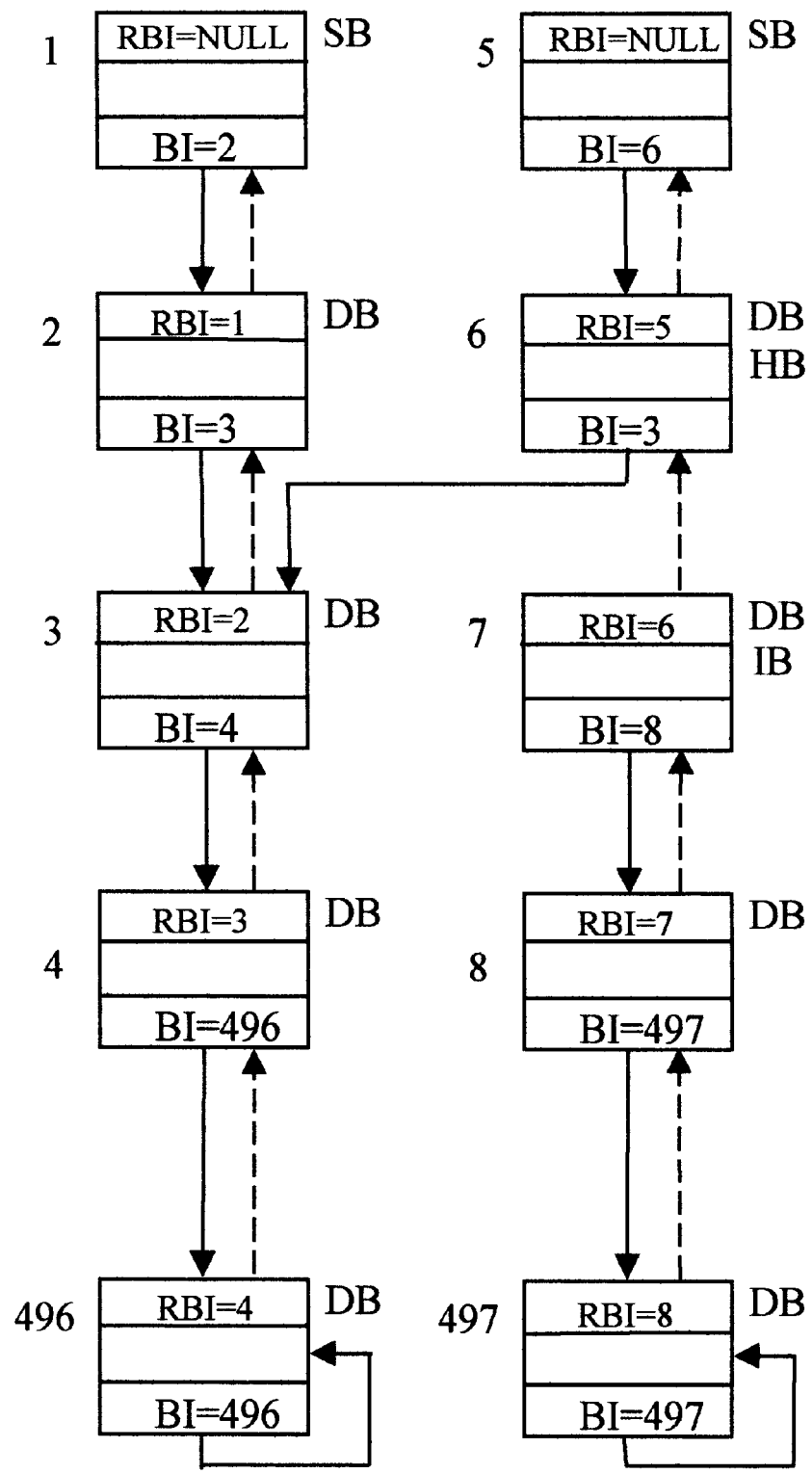
FIG. 6B shows a group of flash memory blocks and spare flash memory blocks among which both flash memory block 2 and flash memory block 6 have BI therein pointing to the same flash memory block 3, while RBI in flash memory block 3 points to flash memory block 2.

Shown in FIG. 6B is a group of flash memory blocks and spare flash memory blocks, among which both flash memory block 2 and flash memory blocks 6 have BI therein pointing to the same flash memory block 3, while RBI in flash memory block 3 points to flash memory block 2, enabling easier conclusion that the BI in flash memory block 6 may be wrong. The scheme to find the right BI in flash memory block 6 is to scan (to check) the RBI in each flash memory block until the flash memory block 7 where RBI=6 is found, thereby the BI in flash memory block 6 is changed to equal to 7 (BI=7).

Figure 6C:
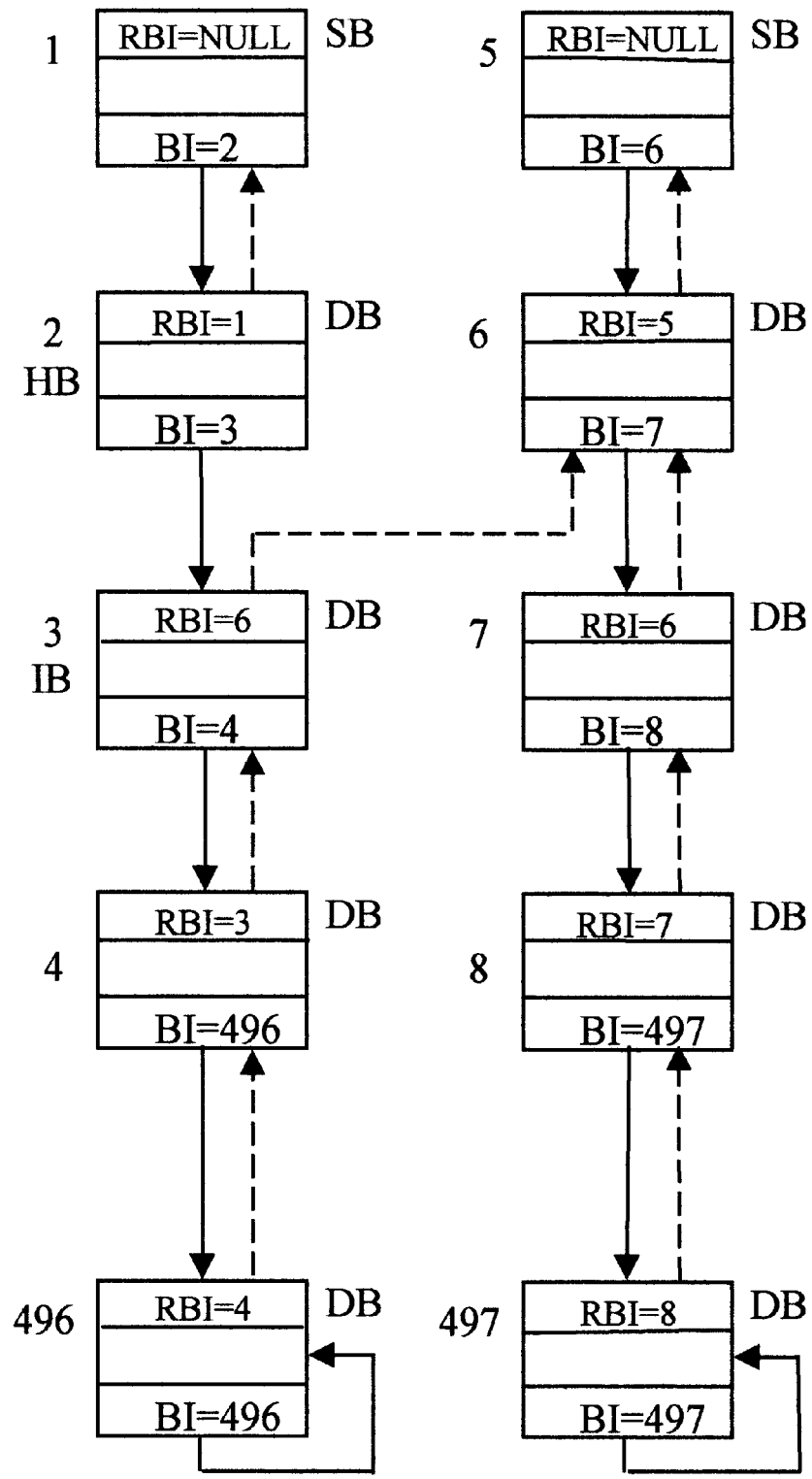
FIG. 6C shows a group of flash memory blocks and spare flash memory blocks among which both flash memory block 3 and flash memory block 7 have RBI therein pointing to the same flash memory block 6.

Shown in FIG. 6C are a group of flash memory blocks and spare flash memory blocks, among which both flash memory block 3 and flash memory block 7 have RBI therein pointing to the same flash memory block 6, while BI in flash memory block 6 points to flash memory block 7, enabling easier conclusion that the RBI in flash memory block 3 may be wrong. The scheme to find the right RBI in flash memory block 3 is to scan (to check) the BI in each flash memory block until the flash memory block 2 where BI=3 is found, thereby the RBI in flash memory block 3 is changed to equal to 2 (RBI=2).

A detection process embodied on the basis of the present invention with FIG. 6B and FIG. 6C as description examples where flash memory block 2 is the assigned block with BI=3 therein may be illustrated as follows: reading the reverse pointer value RBI (=2) included in the guiding data in the pointer memory unit of the access flash memory block flash memory block 3;

if the reverse pointer value (RBI=2) corresponds (a particular and simple case is that "corresponds" means "equals") to the identification code of the assigned flash memory block 2, conclude that flash memory block 3 is the actual access block (shown as IB in figure) of flash memory block 2, and go to the steps of accessing the flash memory block 3;

if flash memory block 6 is the assigned block with BI=3 therein, the reverse pointer value (RBI=2) in flash memory block 3 points to flash memory block 2 which is a flash memory block different from the assigned flash memory block 6, reading an actual access block (shown as IB in figure) (or called access flash memory block) identification code included in the guiding data in the pointer memory unit of flash memory block 2;

if the actual access block identification code (BI=3 here) included in the guiding data in the pointer memory unit of the flash memory block 2 corresponds (a particular and simple case is that "corresponds" means "equals") to the identification code (=3) of the access flash memory block 3, reading the reverse pointer value RBI included in the guiding data in the pointer memory unit of each flash memory block until finding a real access flash memory block (flash memory block 7 here) which is a flash memory block having a reverse pointer value (RBI=6) included in the guiding data in the pointer memory unit thereof corresponding to the identification code of the assigned flash memory block (flash memory block 6 here), replacing the actual access block identification code (=3 here) included in the guiding data in the pointer memory unit of the assigned flash memory block 6 by an identification code (=7 here) corresponding to the real access flash memory block 7;

As shown in FIG. 6C where flash memory block is the assigned block with BI=3 therein pointing to flash memory block 3 which has RBI=6 pointing to flash memory block 6, if the actual access block identification code (BI=7 here) included in the guiding data in the pointer memory unit of flash memory block 6 corresponds (a particular and simple case is that "corresponds" means "equals") to the identification code (=7 here) of a flash memory block (flash memory block 7 here) different from the access flash memory block (flash memory block 3 here), replacing the reverse pointer value RBI included in the guiding data in the pointer memory emit of the access flash memory block flash memory block 3 by an identification code (=2 here) corresponding to the assigned flash memory block 2.

Figure 7:
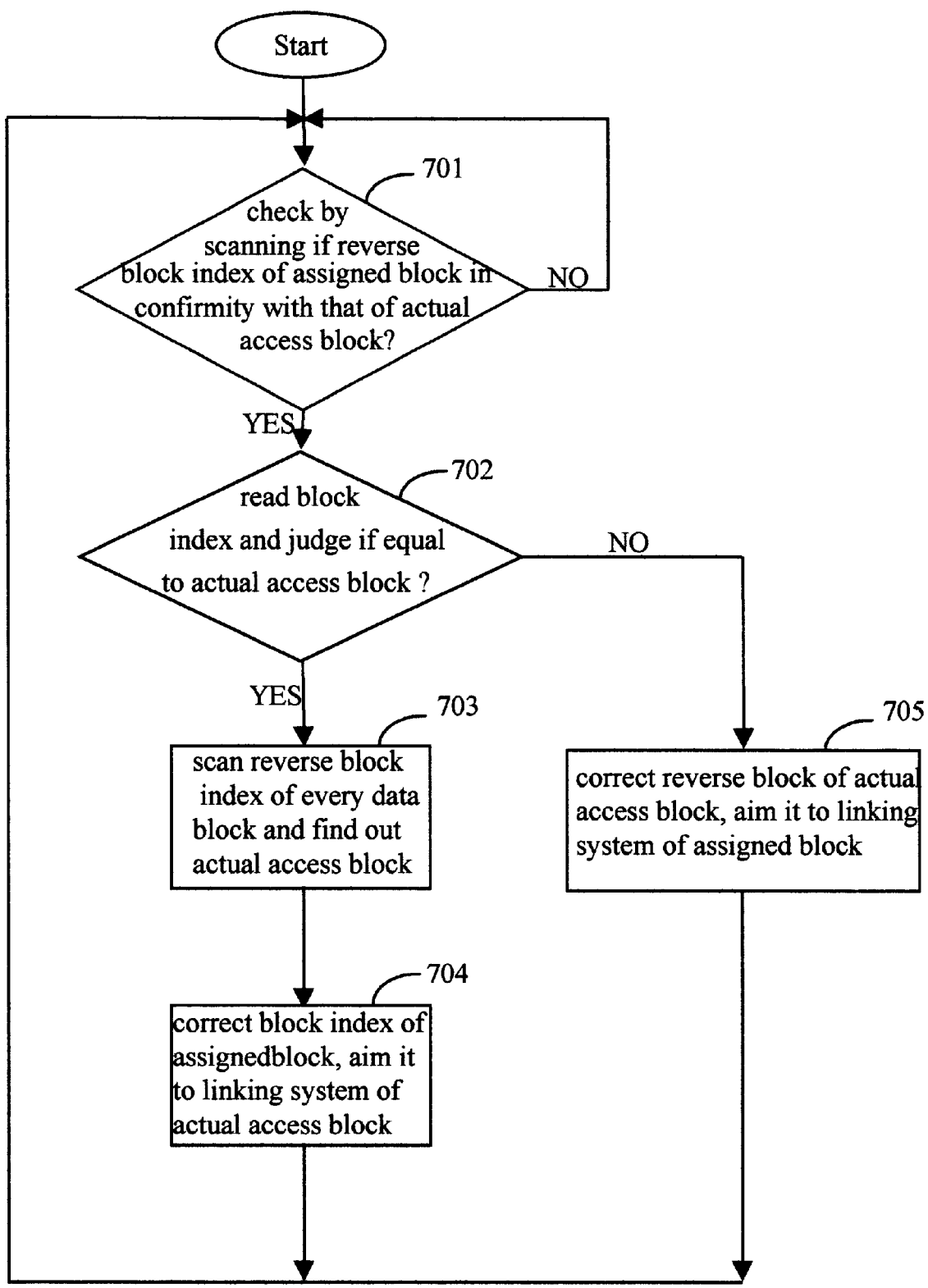
FIG. 7 shows a flow chart illustrating the process of detecting if an actual access block (shown as IB in figure) selected according to the pointer value BI in an assigned block is the right flash memory block for accessing.

Shown in FIG. 7 is a flow chart illustrating the process of detecting if an actual access block (shown as IB in figure) selected according to the pointer value BI in an assigned block is the right flash memory block for accessing.

The steps In FIG. 7 are described hereinafter:

Step 701: whenever a flash memory block is selected as an assigned block, detecting if the RBI in the actual access block (shown as IB in figure) (the block pointed to by the BI in the assigned block) points to the assigned block?

Step 702: does the BI in the flash memory block pointed by the RBI in the actual access block (shown as IB in figure) point to the actual access block (shown as IB in figure)?

Step 703: scanning the RBI in each flash memory block or spare flash memory block until the flash memory block or spare flash memory block having RBI therein pointing to the assigned block is found.

Step 704: amending the BI in the assigned block so that it points to the right actual access block (shown as IB in figure).

Step 705: amending the RBI in the actual access block (shown as IB in figure) so that it points to the right assigned block.

While the invention has been described in terms of what are presently considered to be the most practical and preferred embodiments, it shall be understood that the invention is not limited to the disclosed embodiment. On the contrary, it is intended to cover various modifications and similar arrangements included within the spirit and scope of the following claims which are to be accorded with the broadest interpretation to encompass all modifications and similar structures based thereon.

What is claimed is:

1. A memory device for accessing data comprising:

a plurality of flash memory blocks each being assigned an identification code and each including at least one data memory unit and at least one pointer memory unit, said flash memory block to be assigned for accessing the data memory unit thereof, and a plurality of spare flash memory blocks each also being assigned an identification code and also including at least one data memory unit and at least one pointer memory unit;

in which the data memory unit of said spare flash memory block for writing at least a piece of overwritten data of one of said flash memory blocks that is assigned for accessing, the pointer memory unit of said flash memory block for recording the identification code of said spare flash memory block wherein said overwritten data is written in the data memory unit, the pointer memory unit of said spare flash memory block for recording the identification code of the flash memory block which is assigned for accessing.

2. The memory device according to claim 1 further comprising at least one reservation flash memory block being assigned an identification code and for substituting a flash memory block which fails.

3. The memory device according to claim 1 further comprising at least one reservation flash memory block being assigned an identification code and for substituting a spare flash memory block which fails.

4. The memory device according to claim 1 further comprising at least one failure management block for recording the identification codes of a flash memory block and a spare flash memory block which fail, and the identification codes of reservation flash memory blocks substituting the flash memory block and spare flash memory block which fail.

5. The memory device according to claim 1, wherein said pointer memory unit includes a primary data memory status pointer for recording each written memory position in the data memory unit, and a terminal data memory status pointer for recording each overwritten memory position in the data memory unit.

6. The memory device according to claim 5, wherein said pointer memory unit of said flash memory block further reads the identification code of the spare flash memory block where said overwritten data is written in the data memory unit thereof and said pointer memory unit of said spare flash memory block for reading the identification code of the flash memory block assigned for accessing.

7. The memory device according to claim 1, wherein said pointer memory unit of said flash memory block fturther is recording attribute data for distinguishing said flash memory block from said spare flash memory block, and said pointer memory unit of the spare flash memory block further is recording attribute data for distinguishing said spare flash memory block from said flash memory block.

8. The memory device according to claim 1 further comprising an address allocation device and an addressing circuit, the address allocation device for providing the identification code of the flash memory block to be assigned for accessing, the addressing circuit for addressing the flash memory block and the spare flash memory block assigned for accessing.

9. An access method for accessing a memory system including a plurality of flash memory blocks each having an identification code assigned thereto and each including at least a data memory unit and a pointer memory unit, a plurality of spare flash memory blocks each having an identification code assigned thereto and also including at least a data memory unit and a pointer memory unit, said pointer memory unit for recording guiding data including flag data indicating each written memory position and each overwritten memory position in the data memory unit, said access method comprising a writing process for writing a piece of data in a corresponding position in the data memory unit of one of said plurality of flash memory blocks, said writing process comprising the steps of:

a. assigning a flash memory block to be an access flash memory block;

b. reading the guiding data in the pointer memory unit of said access flash memory block;

c. writing said piece of data in said corresponding position in the data memory unit of said access flash memory block, and updating the flag data in the pointer memory unit of said access flash memory block according to said corresponding position if the guiding data in the pointer memory unit of said access flash memory block corresponds to a predetermined first condition;

d. selecting one said spare flash memory block as an overwritten usage flash memory block to write said piece of data in said corresponding position in the data memory unit thereof, recording as part of the guiding data in the pointer memory unit of said access flash memory block, a pointer value corresponding to the identification code of said overwritten usage flash memory block, updating the flag data in the pointer memory units of both said access flash memory block and the overwritten usage flash memory block according to said corresponding position if the guiding data in the pointer memory unit of said access flash memory block corresponds to a predetermined second condition;

e. identifying one said spare flash memory block which has the identification code thereof corresponding to a pointer value included in the guiding data as an overwritten usage flash memory block to write said piece of data in said corresponding position in the data memory unit thereof, and updating the flag data in the pointer memory units of both said overwritten usage flash memory block and said access flash memory block according to said corresponding position if the guiding data in the pointer memory unit of said access flash memory block corresponds to a predetermined third condition;

f. identifying one said spare flash memory block which has the identification code thereof corresponding to a pointer value included in the guiding data, as an overwritten usage flash memory block, moving the data in the data memory unit of said access flash memory block to the data memory unit of said overwritten usage flash memory block, erasing the data in the data memory unit and pointer memory unit of said access flash memory block, recording as part of the guiding data in the pointer memory unit of said access flash memory block a pointer value corresponding to the identification code of said overwritten usage flash memory block, and recording as part of the guiding data in the pointer memory unit of said overwritten usage flash memory block a pointer value corresponding to the identification code of said access flash memory block, and selecting one said spare flash memory block different from each said overwritten usage flash memory block, as a new overwritten usage flash memory block to write said piece of data in said corresponding position in the data memory tmit thereof, and updating the flag data in the pointer memory units of both said overwritten usage flash memory block and said new overwritten usage flash memory block according to said corresponding position if the guiding data in the pointer memory unit of said access flash memory block corresponds to a predetermined fourth condition; and g. recording as part of the guiding data in the pointer memory block of said overwritten usage flash memory block a pointer value corresponding to the identification code of said new overwritten usage flash memory block.

10. The access method according to claim 9, further comprising the steps of:

a1. selecting one said flash memory blocks as an assigned flash memory block to read an actual access block identification code included in the guiding data in the pointer memory unit thereof; and a2. assigning a flash memory block which has the identification code thereof corresponding to said actual access block identification code as an access flash memory block.

11. The access method according to claim 10 wherein said flash memory block having the identification code thereof associated with said piece of data is selected for reading the actual access block identification code included in the guiding data in the pointer memory unit thereof.

12. The access method according to claim 10 wherein said flash memory block having the identification code thereof associated with an assigned position for writing said piece of data is selected for reading the actual access block identification code included in the guiding data in the pointer memory unit thereof.

13. The access method according to claim 12 wherein said assigned position is provided by an address allocation device.

14. The access method according to claim 9 further comprising a step of recording as part of the guiding data in the pointer memory unit of said access flash memory block, a piece of attribute data for indicating that said access flash memory block becomes one of said spare flash memory blocks.

15. The access method according to claim 9 further comprising the steps of:

a0. providing at least one reservation flash memory block having an identification code assigned thereto, and at least one failure management block; and a3. detecting if said access flash memory block fails, in case said access flash memory block fails, substituting said reservation flash memory block for said access flash memory block, and recording in said failure management block the identification codes of both said access flash memory block and said reservation flash memory block substituting said access flash memory block.

16. The access method according to claim 9 further comprising a reading step of reading the data in the data memory unit of one said flash memory block which is assigned to be a source flash memory block, said reading step comprising the steps of:

reading an actual access block identification code included in the guiding data in the pointer memory unit of said source flash memory block;

selecting one said flash memory blocks having the identification code thereof corresponding to said actual access block identification code as an actual reading block, to read the guiding data in the pointer memory unit thereof;

reading the data in the data memory unit of said actual reading block if the guiding data in the pointer memory unit of said actual reading block meets a predetermined fifth condition; and selecting one of said flash memory blocks having the identification code thereof corresponding to a reader pointer value included in the guiding data, to read the data in the data memory unit thereof if the guiding data in the pointer memory unit of said actual reading block meets a predetermined sixth condition.

17. The access method according to claim 9 wherein said predetermined first condition is that the flag data included in the guiding data indicates nonexistence of said overwritten memory position and said corresponding position is different from each said written memory position indicated by the flag data included in the guiding data, said predetermined second condition is that the flag data included in the guiding data indicates nonexistence of said overwritten memory position and said corresponding position is one of said written memory position indicated by the flag data included in the guiding data, said predetermined third condition is that the flag data included in the guiding data indicates an existence of at least one said overwritten memory position and said corresponding position is different from each said overwritten memory position indicated by the flag data included in the guiding data, said predetermined fourth condition is that the flag data included in the guiding data indicates an existence of at least one said overwritten memory position and said corresponding position is one of said overwritten memory position indicated by the flag data included in the guiding data.

18. The access method according to claim 16 wherein said predetermined fifth condition is that the flag data included in the guiding data indicates nonexistence of said overwritten memory position, and said predetermined sixth condition is that the flag data included in the guiding data indicates an existence of at least one overwritten memory position.

19. The access method according to claim 10 further comprising the steps of:
   a4. reading a reverse pointer value included in the guiding data in the pointer memory unit of said access flash memory block;
   a5. if the reverse pointer value corresponds to the identification code of said assigned flash memory block, go to step b;
   a6. reading an actual access block identification code included in the guiding data in the pointer memory unit of the reverse pointing flash memory block if the reverse pointer value corresponds to the identification code of a reverse pointing flash memory block which is one of said flash memory blocks different from said assigned flash memory block;
   a7. reading a reverse pointer value included in the guiding data in the pointer memory unit of each said flash memory block until finding a real access flash memory block which is one of said flash memory blocks having a reverse pointer value included in the guiding data in the pointer memory unit thereof corresponding to the identification code of said assigned flash memory block, replacing said actual access block identification code included in the guiding data in the pointer memory unit of said assigned flash memory block by an identification code corresponding to said real access flash memory block if the actual access block identification code included in the guiding data in the pointer memory unit of said reverse pointing flash memory block corresponds to the identification code of said access flash memory block; and
   a8. replacing the reverse pointer value included in the guiding data in the pointer memory unit of said access flash memory block by an identification code corresponding to said assigned flash memory block if the actual access block identification code included in the guiding data in the pointer memory unit of the reverse pointing flash memory block corresponds to the identification code of one of said flash memory blocks different from said access flash memory block.

20. An access method for accessing a memory system including a plurality of flash memory blocks each having an identification code assigned thereto and each including at least a data memory unit and a pointer memory unit, and includes a plurality of spare flash memory blocks each also having an identification code assigned thereto and also including at least a data memory unit and a pointer memory unit, the pointer memory unit for recording guiding data which includes flag data indicating each written memory position and each overwritten memory position in the data memory unit, said access method comprising a writing process for writing a piece of data in a corresponding position in the data memory unit of an assigned flash memory block which is selected from among said flash memory blocks, said writing process comprising the steps of:
   a. reading an actual access block identification code included in the guiding data in the pointer memory unit of said assigned flash memory block;
   b. selecting a flash memory block which has the identification code thereof corresponding to said actual access block identification code as an access flash memory block;
   c. reading the guiding data in the pointer memory unit of said access flash memory block;
   d. writing said piece of data in said corresponding position in the data memory unit of said access flash memory block, and updating the guiding data in the pointer memory unit according to said corresponding position if the guiding data in the pointer memory unit of said access flash memory block corresponds to a predetermined first condition;
   e. selecting one of said are flash memory blocks as an overwritten usage flash memory block to write said piece of data in said corresponding position in the data memory unit thereof, recording as part of the guiding data in the pointer memory unit of said access flash memory block, as part of the guiding data, a pointer value corresponding to the identification code of the overwritten usage flash memory block, and updating the guiding data in the pointer memory units according to said corresponding position if the guiding data in the pointer memory unit of said access flash memory block corresponds to a predetermined second condition;
   f. identifying one of said spare flash memory blocks which has the identification code thereof corresponding to a pointer value included in the guiding data, as an overwritten usage flash memory block to write said piece of data in said corresponding position in said data memory unit thereof, and updating said guiding data in said pointer memory units according to said corresponding position if the guiding data in the pointer memory unit of said access flash memory block corresponds to a predetermined third condition;
   g. identifying one of said spare flash memory blocks which has the identification code thereof corresponding to a pointer value included in the guiding data, as an overwritten usage flash memory block, moving the data in the data memory unit of said access flash memory block to the data memory unit of said overwritten usage flash memory block, erasing the data in the data memory unit and pointer memory unit of said access flash memory block, recording as part of the guiding data in the pointer memory unit of said access flash memory block a pointer value corresponding to the identification code of said overwritten usage flash memory block, and recording as part of the guiding data in the pointer memory unit of said overwritten usage flash memory block a pointer value corresponding to the identification code of said access flash memory block, and selecting one of said spare flash memory blocks different from each said overwritten usage flash memory block, as a new overwritten usage flash memory block to write said piece of data in said corresponding position in the data memory unit thereof, and updating the guiding data in the pointer memory unit according to said corresponding position if the guiding data in the pointer memory unit of said access flash memory block corresponds to a predetermined fourth condition; and h. recording as part of the guiding data in the pointer memory unit of the overwritten usage flash memory block a pointer value corresponding to the identification code of said new overwritten usage flash memory block.

* * * * *